United States Patent [19]

Haeusler

[11] Patent Number: 4,480,739

[45] Date of Patent: Nov. 6, 1984

[54] METHOD AND APPARATUS FOR SEPARATING, ORDERING AND FEEDING METALLIC WORKPIECES

[75] Inventor: Jochen Haeusler, Nürnberg-Laufamholz, Fed. Rep. of Germany

[73] Assignee: Siemens Aktiengesellschaft, Munich, Fed. Rep. of Germany

[21] Appl. No.: 472,873

[22] Filed: Mar. 8, 1983

Related U.S. Application Data

[63] Continuation of Ser. No. 221,252, Dec. 30, 1980, abandoned.

[30] Foreign Application Priority Data

Jan. 22, 1980 [DE] Fed. Rep. of Germany ....... 3002168

[51] Int. Cl.³ .............................................. B65G 35/00
[52] U.S. Cl. .................................. 198/381; 221/200; 198/619; 198/953
[58] Field of Search ....................... 198/619, 381, 953; 414/116, 754, 112; 221/156, 157, 163, 171, 200, 160, 204; 209/227, 539, 911, 921, 922; 266/237

[56] References Cited

U.S. PATENT DOCUMENTS

| | | | |
|---|---|---|---|
| 2,940,583 | 6/1960 | Lovercheck | 198/619 |
| 3,045,393 | 7/1962 | Knott | 198/619 |
| 3,118,564 | 1/1964 | Vokes | 198/953 |

*Primary Examiner*—Robert J. Spar
*Assistant Examiner*—Dennis J. Williamson
*Attorney, Agent, or Firm*—Kenyon & Kenyon

[57] ABSTRACT

A method and apparatus for separating, ordering, and feeding metallic workpieces, particularly hard-to-handle workpieces which become easily entangled with one another, from a disorganized pile of workpieces. A traveling electromagnetic field is produced by a three-phase motor stator. The stator may be of the linear type, or either internal or external rotor type, cylindrical three-phase motor stators. Metallic workpieces are disposed within the traveling field, and experience stochastic motions therein. When organized, the metallic workpieces are oriented substantially perpendicular to the direction of travel of the traveling magnetic field. Discharge channels may be provided to transport the oriented workpieces to a pick-up point.

4 Claims, 3 Drawing Figures

METHOD AND APPARATUS FOR SEPARATING, ORDERING AND FEEDING METALLIC WORKPIECES

This application is a continuation of application Ser. No. 221,252, filed Dec. 30, 1980 now abandoned.

BACKGROUND OF THE INVENTION

This invention relates to systems for separating, ordering and feeding workpieces through machinery, and more particularly, to apparatus for arranging randomly distributed metallic workpieces into predetermined order.

Although progress is continuously being made in the development of new methods and equipment for the machining of workpieces, much time and effort is expended in organizing the workpieces, which may be randomly disposed in a box or in a pile, into a structured arrangement which is suitable for efficiently supplying workpieces to automated machining and assembly systems. The workpiece supply problem is especially acute in systems which are required to supply difficult-to-handle workpieces, such as springs, which are easily entangled with one another.

The prior art has thrust at this problem by developing automatic systems, in addition to manual systems, which utilize gravity and mechanical impact, such as vibration conveyors and vibrating boards, and compressed air systems. In general, these devices and systems are optimized experimentally and are empirically adapted for handling specific workpieces. These systems, however, do not solve the problem of organizing the multitude of hard-to-handle workpieces, such as those which are easily tangled, formed of irregular material or thin plates, or constructioned with coarse tolerances. The known systems for handling workpieces can be applied only inefficiently, if at all, to workpieces having the foregoing characteristics.

One known prior art effort to provide a system for separating, ordering and feeding metallic workpieces utilizes magnetic fields from AC or DC magnets. In such systems, individual workpieces which are moved near stationary magnets are organized in an ordered arrangement. Other known magnetic systems which use non-uniform, stationary magnetic fields have been used to separate, orient, and feed irregular workpieces, such as electronic components, at a pickup point. Such magnetic systems, however, are limited in use for handling workpieces which are not easily entangled with one another, such as diodes with axial leads. Systems utilizing rigid or moving, DC or AC magnets are known for handling sheet metal workpieces.

Prior art improvements to the foregoing systems which utilize non-uniform, stationary magnetic fields have resulted in systems which utilize pulse-shaped magnetic fields. Although such pulse-shaped field systems are useful for orienting workpieces with respect to one another and feeding the work pieces to machinery, these systems are useful for handling workpieces which do not vary substantially in size and shape from one another.

It is, therefore, an object of this invention to provide an improved apparatus for separating, ordering and feeding a variety of metallic and hard-to-handle workpieces.

SUMMARY OF THE INVENTION

The foregoing and other objects are achieved by this invention which provides apparatus for separating, ordering and feeding metallic workpieces to a machine, by subjecting a disorganized pile of such workpieces to a traveling magnetic field. In one embodiment of the invention, a rotating magnetic field is generated in the interior of a three-phase motor stator. Alternatively, a rotating magnetic field is produced along the outer circumference of a three-phase motor stator, the motor being of the external rotor type. In still further embodiments, a traveling magnetic field may be linearly propagated along a stator of a linear motor.

In a specific illustrative embodiment of the invention which utilizes a linearly moving magnetic field, a stator of a linear motor is disposed within a casting of non-magnetic material. The workpieces are placed in a disorganized pile on the upper surface of the non-magnetic casting. A transparent covering, such as a Plexiglas hood, may be placed over the entire assembly to contain the workpieces.

In an apparatus embodiment of the invention which utilizes a stator assembly of an internal rotor, three-phase motor, a layer of non-magnetic material, in the form of a cylinder, is arranged within the stator. The open ends of the cylinder are closed by non-magnetic, transparent discs, which may be made of Plexiglas.

Linear stator arrangements may be provided in combination with a thin, non-metallic conveyor belt. The conveyor belt transports the metallic workpieces so as to be within the influence of the magnetic field produced by the linear stator. In such an arrangement, the direction of travel of the magnetic field would be perpendicular to the transport direction of the conveyor belt.

Although it is known, by persons skilled in the art of designing electric machines, that the forces of an electromagnetic traveling field can be utilized for transporting liquids and metallic ribbons, and ordering individual pieces, it is a surprising feature of this invention that such electromagnetic traveling fields can be efficiently utilized to disentangle, separate, order, and feed metallic workpieces.

BRIEF DESCRIPTION OF THE DRAWINGS

Comprehension of the invention is facilitated by reading the following detailed description in conjunction with the annexed drawings, in which.

DETAILS OF DESCRIPTION

Figure 1:
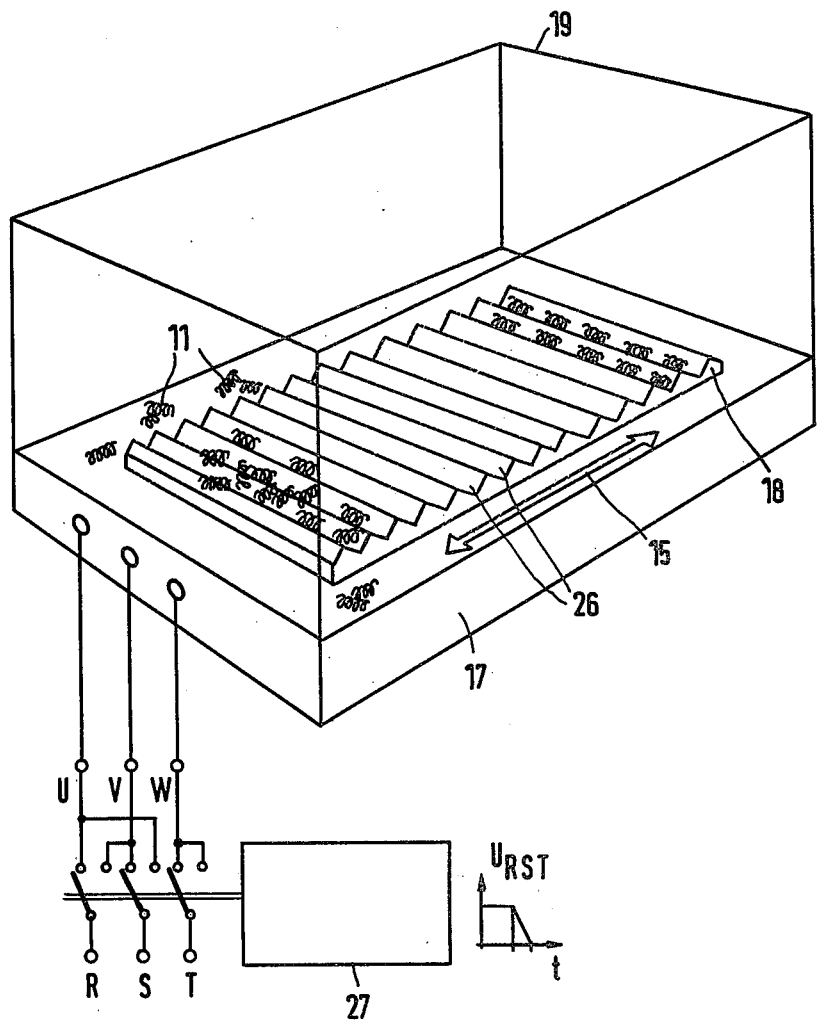
FIG. 1 is a perspective view of an apparatus which utilizes a linear traveling magnetic field in accordance with the principles of the invention.

FIG. 1 shows an apparatus constructed in accordance with the invention for separating and ordering coil springs which tend to become entangled with one another. A non-metallic ordering device 18 is disposed over stator 17 of a linear motor. Stator 17 is advantageously encased within a non-magnetic material. Ordering device 18 is provided with a plurality of slots 26 which are adapted to maintain a plurality of workpieces in the form of coil springs 11 in a direction perpendicular to the direction of the travel of the traveling field as shown by arrow 15. A transparent cover 19, which may be formed of Plexiglas, is provided over stator 17.

As indicated, coil springs 11 are disposed in a disorganized pile on the surface of stator 17. If a three-phase winding (not shown) within stator 17 is connected to a power transmission net work $U_{RST}$, the pile of coil springs 11 gradually dissolves as springs 11 execute stochastic motions. In response to the traveling field, springs 11 rotate and repel one another until they are aligned parallel with slots 26, and perpendicular to the direction 15 of the traveling field. The springs travel over ordering device 18 in a direction which is against the direction of travel of the field. During this process, the separated ones of springs 11 remain lying in slots 26.

If the direction of travel of the traveling field is reversed, such as by reversing the connections between conductors U and V, with respect to transmission line conductors R and S, coil springs 11 may be distributed throughout slots 26 on ordering device 18. Reversal of the direction of the traveling field may be controlled visually, or by an automatic control 27 which may contain a timing device (not shown). When the process of organizing coil springs 11 in slots 26 has been completed, the voltages on conductors U, V, and W are gradually reduced to zero, so as to avoid magnetization of the workpieces.

Figure 2:
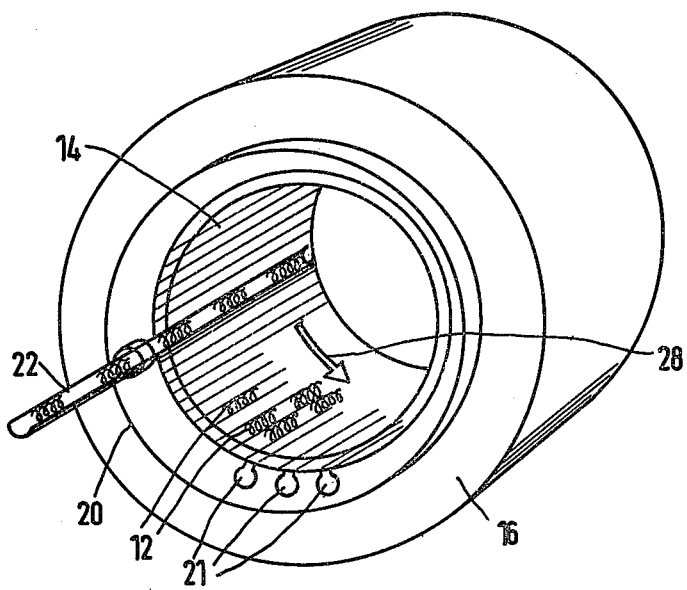
FIG. 2 is a perspective view of an apparatus which utilizes a rotating field in accordance with the principles of the invention.

FIG. 2 shows an embodiment of the invention in which the separating and ordering of workpieces, illustratively coil springs 12, occurs in a rotating field 14 of a three-phase motor stator 16. The interior portion of stator 16 is covered by a non-magnetic cylinder 20 which is closed at its ends by a pair of non-magnetic, transparent discs (not shown). Coil springs 12 are placed in a pile within cylinder 20. The application of three-phase electrical energy at terminals 21 causes field 14 to rotate in the direction of arrow 28. Field 14 causes springs 12 to rotate in the interior of cylinder 20 and to execute stochastic motions. A discharge channel 22 is provided for receiving separated ones of the coil springs which are parallel to a central longitudinal axis (not shown) of cylinder 20. Springs 12 travel along discharge channel 22 to further processing points.

Figure 3:
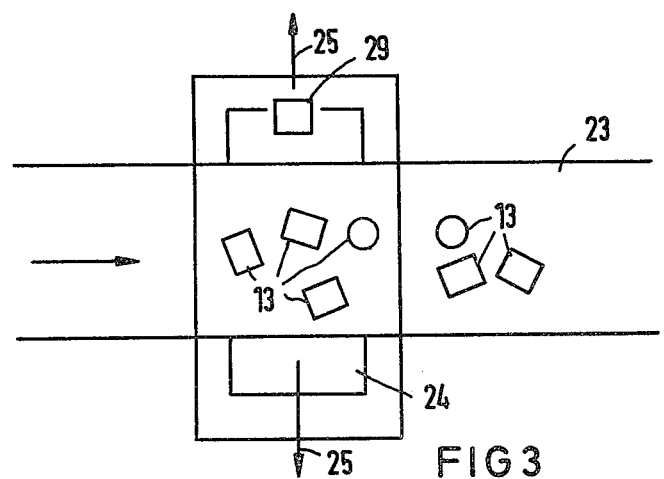
FIG. 3 is a schematic representation of an apparatus which utilizes a conveyor belt for transporting workpieces to a linear, traveling magnetic field.

FIG. 3 shows apparatus constructed in accordance with the invention which may be employed in a quality control operation. In this embodiment, a plurality of metallic tube section 13 having heavy bottoms are transported on a thin, non-metallic conveyor belt 23 over a linear-motor stator 24 which produces a traveling field in directions 25. Traveling field directions 25 are perpendicular to the direction of travel of conveyor belt 23. In this specific illustrative embodiment, defective ones of metallic tube sections 13 which do not contain the heavy bottoms are removed from conveyor belt 23 by the traveling field produced by stator 24. A defective tube section which has been removed from conveyor belt 23 is identified with reference number 29. Metallic tube sections which contain the heavy bottom are only slightly affected by the traveling field, and remain on conveyor belt 23.

Although the inventive concept disclosed herein has been described in terms of specific embodiments and applications, other applications and embodiments will be obvious to persons skilled in the pertinent art without departing from the scope of the invention. The drawings and the descriptions of specific embodiments of the invention in this disclosure are illustrative of applications of the invention and should not be construed to limit the scope thereof.

What is claimed is:

1. Apparatus for separating and ordering metallic workpieces from a disorganized pile of workpieces comprising:
   (a) a three-phase linear motor stator encased within non-magnetic material for generating a travelling electromagnetic field;
   (b) a non-metallic orienting device disposed over said linear motor stator, said orienting device containing a plurality of grooves matched to the workpieces and at right angles to the travelling electromagnetic field such that when the electromagnetic field is generated the workpieces will be agitated by the grooved surface, will be separated from one another, and will be aligned in the grooves; and
   (c) a non-magnetic hood disposed over said orienting device enclosing the space around said stator.

2. Apparatus according to claim 1, wherein said workpieces comprise spiral springs which are stacked and hooked to each other.

3. Apparatus for separating and ordering metallic workpieces comprising:
   (a) a three-phase motor stator for generating a rotating field, said stator having a bore with an axis;
   (b) a non-magnetic cylindrical member matched to said stator bore, covering the inside of said stator;
   (c) first and second non-magnetic transparent disks closing off the ends of said bore; and
   (d) a discharge channel for receiving separated workpieces extending through one of said disks in a direction at right angles to the direction of said rotating field and parallel to said axis whereby the workpieces are moved by the rotating field until the workpieces separate from one another and become aligned with the discharge channel.

4. Apparatus according to claim 3, wherein metallic workpieces comprise spiral springs stacked and hooked to one another.

* * * * *